(12) United States Patent
Reinhardt

(10) Patent No.: US 6,936,103 B2
(45) Date of Patent: Aug. 30, 2005

(54) LOW INDIUM CONTENT QUANTUM WELL STRUCTURES

(75) Inventor: Frank Reinhardt, Tucson, AZ (US)

(73) Assignee: Spectra-Physics, Inc., Tucson, AZ (US)

(*) Notice: Subject to any disclaimer, the term of this patent is extended or adjusted under 35 U.S.C. 154(b) by 122 days.

(21) Appl. No.: 10/410,835

(22) Filed: Apr. 11, 2003

(65) Prior Publication Data

US 2004/0200407 A1 Oct. 14, 2004

(51) Int. Cl.$^7$ .............................................. C30B 25/08
(52) U.S. Cl. ........................ 117/89; 117/102; 117/105; 117/953; 117/955
(58) Field of Search ..................... 117/89, 102, 105, 117/953, 955

(56) References Cited

U.S. PATENT DOCUMENTS

| | | | | |
|---|---|---|---|---|
| 4,410,993 A | * | 10/1983 | Zschauer | 372/44 |
| 4,910,743 A | * | 3/1990 | Ohba et al. | 372/45 |
| 4,944,811 A | * | 7/1990 | Sukegawa et al. | 148/33.1 |
| 4,991,540 A | | 2/1991 | Jurgensen | 118/715 |
| 5,285,308 A | * | 2/1994 | Jenkins et al. | 359/260 |
| 5,685,904 A | | 11/1997 | Pinzone | 117/89 |
| 5,747,113 A | * | 5/1998 | Tsai | 427/255.5 |
| 5,805,624 A | * | 9/1998 | Yang et al. | 372/45 |
| 5,898,721 A | | 4/1999 | He | 372/45 |
| 5,994,158 A | | 11/1999 | Kashima | 438/47 |
| 6,219,365 B1 | | 4/2001 | Mawst | 372/46 |
| 6,304,587 B1 | | 10/2001 | Zah | 372/46 |
| 6,309,465 B1 | | 10/2001 | Jurgensen | 118/715 |
| 6,368,404 B1 | * | 4/2002 | Gurary et al. | 117/89 |
| 6,383,330 B1 | | 5/2002 | Raaijmakers | 156/345 |
| 6,711,194 B2 | * | 3/2004 | Ohkubo et al. | 372/45 |

OTHER PUBLICATIONS

D. Kim et al, "Al free Active Region High Power Laser Diode Array on Misoriented Wafers", CLEO, Pacific Rim '99, pp 1095–1096.
A. Knauer et al, "Properties of (InGa)(AsP) interfaces grown under different MOVPE conditions", 11$^{th}$ Int. Conf. on Metalorganic Vapor Phase Epitaxy, Berlin, Jun. 3–7, 2002.
T.K. Sharma, et al, "MOVPE growth of InCaAsP on GaAs substrates near the miscibility gap", 11$^{th}$ Int. Conf. on Metalorganic Vapor Phase Epitaxy, Berlin, Jun. 3–7, 2002.
B. R. Wu et al, "Comparison of GaINNAs/GaAs Quantum Well Lasers grown in Different Temperatures", 11$^{th}$ Int. Conf. on Metalorganic Vapor Phase Epitaxy, Berlin, Jun. 3–7, 2002.

* cited by examiner

Primary Examiner—Robert M. Kunemund
(74) Attorney, Agent, or Firm—Howard R. Popper

(57) ABSTRACT

A method of suppression of Indium carry-over in the MOCVD growth of thin InGaAsP quantum wells, with low Indium content, on top of thick GaInAsP, with high Indium content. These quantum wells are essential in the stimulated emission of 808 to 880 nm phosphorous-based laser structures. The Indium carryover effect is larger in large multi wafer reactors and therefore is this invention focused on large multiwafer MOCVD reactors. This invention improves the quality of the quantum well, as measured by photoluminescence spectra and uniformity of wavelength radiation.

7 Claims, 3 Drawing Sheets

LOW INDIUM CONTENT QUANTUM WELL STRUCTURES

FIELD OF THE INVENTION

This invention relates to the manufacture of heterojunction lasers employing indium, and more particularly to controlling indium migration in large scale MOCVD production processes.

BACKGROUND OF THE INVENTION

The typical semiconductor diode laser includes an n-type layer, a p-type layer and an undoped active layer between them such that when the diode is forward biased electrons and holes recombine in the active region layer with the resulting emission of light. The layers adjacent to the active layer typically have a lower index of refraction than the active layer and form cladding layers that confine the emitted light to the active layer and sometimes to adjacent layers. In fabricating such devices each individual semiconductor layer is grown epitaxially using a crystal growth technique.

One of the best known crystal growth techniques is low pressure metallo-organic chemical vapor deposition (LP-MOCVD) carried on in a controlled atmosphere reactor oven. In this method, source gases such as metal alkyls and hydrides are mixed and pyrolized in a hydrogen atmosphere to grow thin single crystals of semiconductor material upon a substrate. Specifically, a first growth stage is initiated when a first gaseous mixture is introduced into the reactor and completed when a thin single crystal layer is grown. After the first growth stage, a brief interval may follow to allow the gases from the first growth stage to clear out of the reactor and to ready the second gaseous mixture. Then, the second growth stage is initiated by introducing the second gaseous mixture into the reactor for growth of the next thin crystal layer. The growth stages are repeated in this manner until the desired heterostructure is grown.

It has recently become desirable to produce 8xx nm lasers whose quantum well and waveguide layers are aluminum free with some aluminum content permitted only in the cladding layers. Devices having aluminum-free quantum well and waveguide layers are desirable because they are not susceptible to COD (catastrophic optical destruction) which may occur in lasers containing aluminum in these layers. Although high output powers have been obtained from the AlGa(In)As active-layer devices, long-term reliability is still an open question because, even if the mirror facets are passivated, defects in the mirror facet lead to COD. Accordingly, among those heterostructures that are of interest are those which may be characterized in shorthand form as AlGaInP/GaInP/$\underline{In_xGa_{1-x}As_{1-y}P_y}$, where x, y are small and where the underlined portion identifies the composition of the quantum well.

Semiconductor structures for 8xx nm lasers on GaAs substrates may use various mixture proportions of Ga, In, As and P in the active region. A phase diagram for these materials is shown in FIG. 4 where the upper left-hand corner represents maximum GaAs content; the upper right-hand corner represents maximum In content; the lower left-hand corner represents maximum GaP content; and the lower right-hand corner represents maximum InP content. The straight slant line is the locus of lattice matching of the active region with the GaAs substrate while the curved lines represent the locii of mixtures resulting in layers over the range from 2.0 to 1.2 electron-volts, corresponding to emissions at wavelengths from 600 to 1000 nm.

In theory, a laser device emitting at a desired wavelength may be produced using any of the combinations of GaAs, InAs, InP and GaP falling along the corresponding electron-volt line. In practice, however, there are some limitations or tradeoffs. First, the stress increases with increasing distance from the GaAs-matching line, limiting their thickness (critical thickness).

Secondly there is a zone in which combinations of these materials are poorly miscible (miscibility gap). It is somehow desirable to avoid combinations within the zone of poor miscibility. Taking both restrictions in account in the design of 8xx nm material, the desired quantum well material becomes $In_xGa_{1-x}As_{1-y}P_y$ (where x, y are small), sandwiched between $Ga_{0.5}In_{0.5}P$ barriers, with high Indium amount (e.g., about 50%). Therefore the task is to grow very thin low Indium containing material on top of high Indium containing material. This was studied in the last decade.

Guimaraes, et al as reported in the 1992 Journal of Crystal Growth, studied the growth of GaInP/GaAs hetero structures in LP-MOCVD reactors. Guimaraes study attempted to account for the existence of an anomalous ("Q-line"). A photoluminescent emission band of high intensity radiation occurred at the GaInP-to-GaAs interface at an energy level below the band gap of GaAs. Variations of growth temperature, $AsH_3$ partial pressure, gas switching sequence and growth interruption times were experimented with but could not eliminate the anomalous radiation.

From the results of experiments carried out in a horizontal MOVPE reactor, Guimaraes postulated that a spurious quaternary (GaInPAs) layer was formed at the GaInP-to-GaAs interface, apparently due to the instability of the GaInP surface under $AsH_3$ purging, which caused partial substitution of P by As (i.e., P desorption). The 1992 article reported that the formation of the quaternary layers responsible for the anomalous radiation could be prevented by introducing a 1-nm thick layer of GaP during the growth interruption. $PH_3$ was switched off for 2 seconds and $AsH_3$ is switched on for 3 seconds before the growth of the GaAs quantum well is started). This technique was reported to prevent "As incorporation into the GaInP layer".

Two years later, in 1994, another group of researchers came to a different conclusion for the source and for the remediation of the anomalous radiation. Tsai, et alia reporting in the Journal of Crystal Growth concluded that the parasitic quaternary layer occurring when GaAs was grown on GaInP was caused by parasitic incorporation of unwanted indium. Tsai reported no success in suppressing the "Q-line" radiation using the 1992 Guimaraes technique, even though GaP intermediate layers of 1, 2 and 3 nm thicknesses were tried. Instead, Tsai et al resorted to using a very thin layer of AlGaAs with somewhat mixed results.

Both the Guimaraes and Tsai experiments were carried out in small-scale laboratory environments where throughput rate and product uniformity are not of primary concern. An industrial environment places great emphasis not only on these requirements but also on the ability to produce lasers having uniform and specifiable radiation wavelengths. Accordingly, it would be advantageous to provide an efficient and reliable method for producing 8xx laser crystal structures in large, multi-wafer planetary MOCVD reactors which emit at a specifiable and uniform wavelength, which do not emit spurious Q-line radiation.

SUMMARY OF THE INVENTION

We have discovered a method to suppress the unwanted incorporation of Indium in GaAs Quantum Well deposition on GaInP. The size and geometry of the reactor is a contributing factor to the growth of the spurious quaternary (GaInPAs) layer at the GaInP-to-GaAs interface due to a residual build up of indium on up-stream susceptor surfaces. In accordance with the principles of the invention, growth of a 880 nm quantum well laser structure is achieved without creating spurious quaternary layers and without resorting to the introduction of Al content near the quantum well. After the GaInP layer is grown, 3 seconds of trimethylgallium and phosphine are introduced before growing GaAs to form over all susceptor surfaces a pseudo-morphic GaInP layer that encapsulates any indium from the previously grown layer. By such encapsulation of residual indium, the constituent vapors for the quantum well layer may then be introduced in proportions that avoid the zone of poor miscibility while achieving radiation at a desired wavelength and appropriate strain resulting in a factor of three improvement in wavelength uniformity from (1.5 nm to 0.5 nm). This procedure resulted in reduction of the "GaAs" quantum wells wavelength of about 25 nm, corresponding to the removal of ~3% parasitic indium from the quantum well which has enabled us to engineer structures with even lower indium concentration, as required for an exemplary high power 880 nm laser.

BRIEF DESCRIPTION OF THE DRAWING

The foregoing and other objects are achieved in accordance with the principles of the invention in the illustrative embodiment which will become apparent from a reading of the ensuing description and drawing, in which.

GENERAL DESCRIPTION

Figure 1:
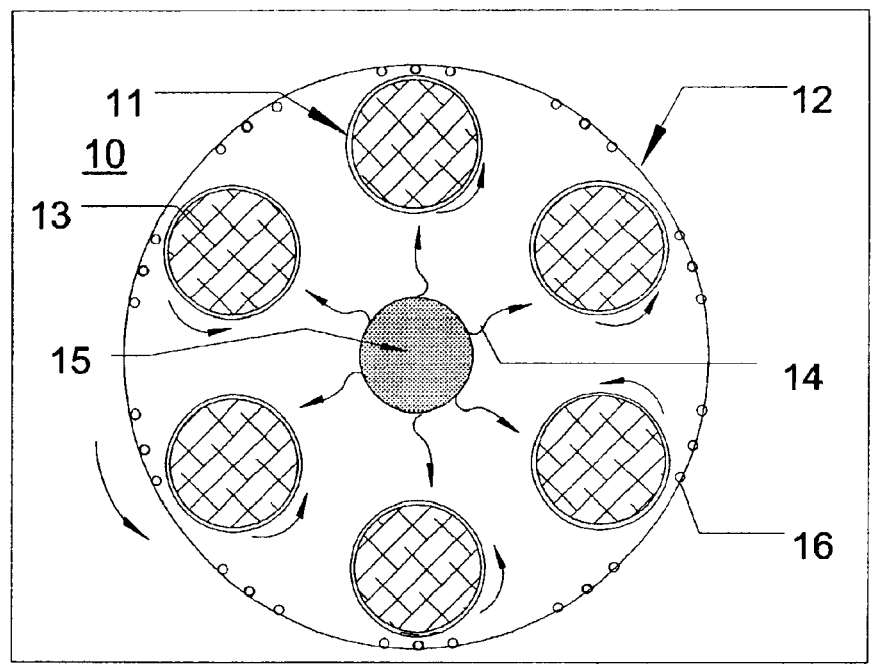
FIGS. 1 and 2 show, in schematic form, plan and elevation views of a commercial multi-wafer reactor used in LP MOVCD crystal growth.
Figure 2:
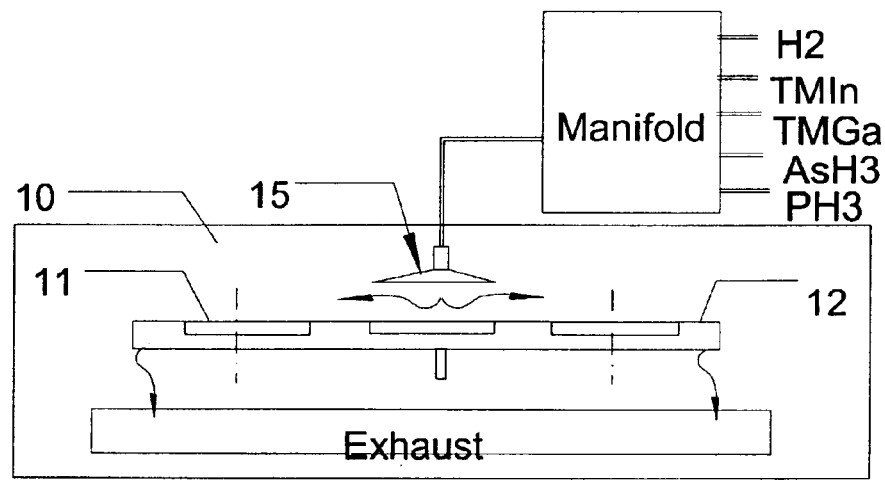

Referring to FIGS. 1 and 2 a planetary reactor 10 comprises an oven chamber operating at less than atmospheric pressure, typically 100 millibars, into which metallo-organic source gases are introduced from a manifold. Typically, gases such as hydrogen ($H_2$), phosphine ($PH_3$), arsine ($AsH_3$) and vapors of trimethylindium (TMIn), trimethylgallium (TMGa will be sequentially admitted. Compound semiconductor layers will be formed from these gases onto the surfaces of a number of planetarily arranged wafers 13 mounted on a respective plurality of rotating susceptors 11. Illustratively, the reactor includes eight rotating susceptors. The rotating susceptors are mounted on a turntable 12, which also rotates so that each wafer executes an epicyclic motion. A controlled manifold selectively admits the gases and vapors 14 to reactor chamber 10 via a central diffuser 15 from which they flow over the surfaces of the susceptors and wafers to the periphery of turntable 12 where they are sucked through ports 16 to the exhaust.

Figure 3:
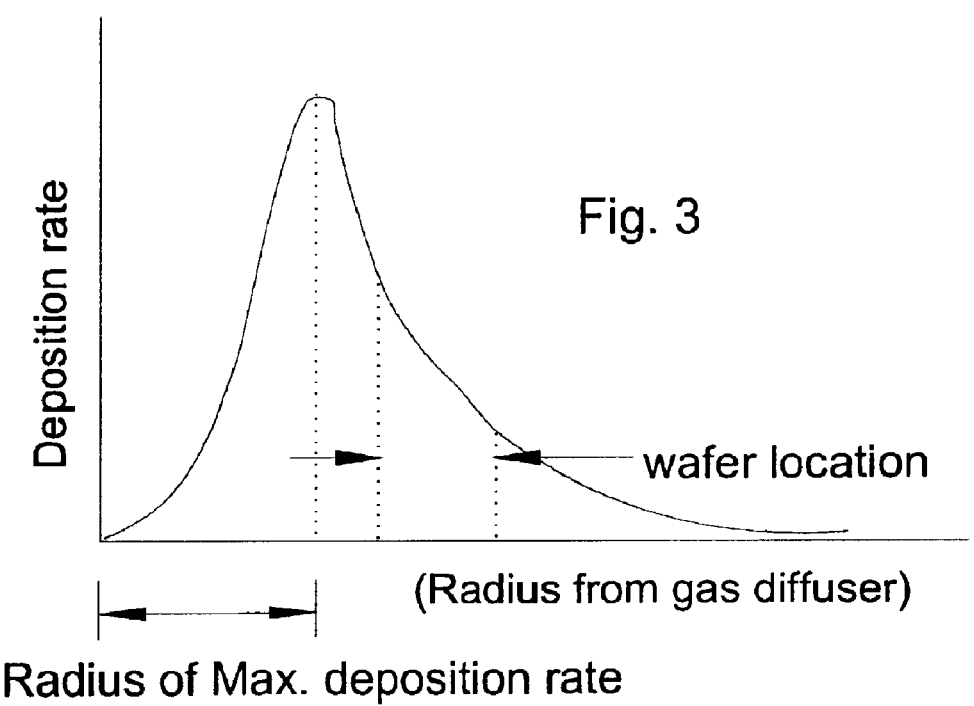
FIG. 3 shows the build up of spurious indium on upstream susceptor surfaces as a function of radial distance from the reactant gas source.

The deposition of compound semiconductor materials from the organo-metallic vapors does not occur uniformly over the horizontal surface areas within the reactor so that susceptor rotation is required to average out the deposition rate over the surface areas of the wafers. FIG. 3 shows a plot of the deposition rate versus distance from the central diffuser 15. Moreover, the deposition rate is not at its maximum over the surface areas of the wafers but lies at a radius outward of the central diffuser and inboard (upstream) of the wafers. The extent of the area abutting the radius of maximum deposition rate is comparable to, or may even exceed the total wafer area. This radius of maximum deposition rate varies somewhat depending upon whether GaAs or InGaAs is being deposited, but its general character is similar.

Figure 4:
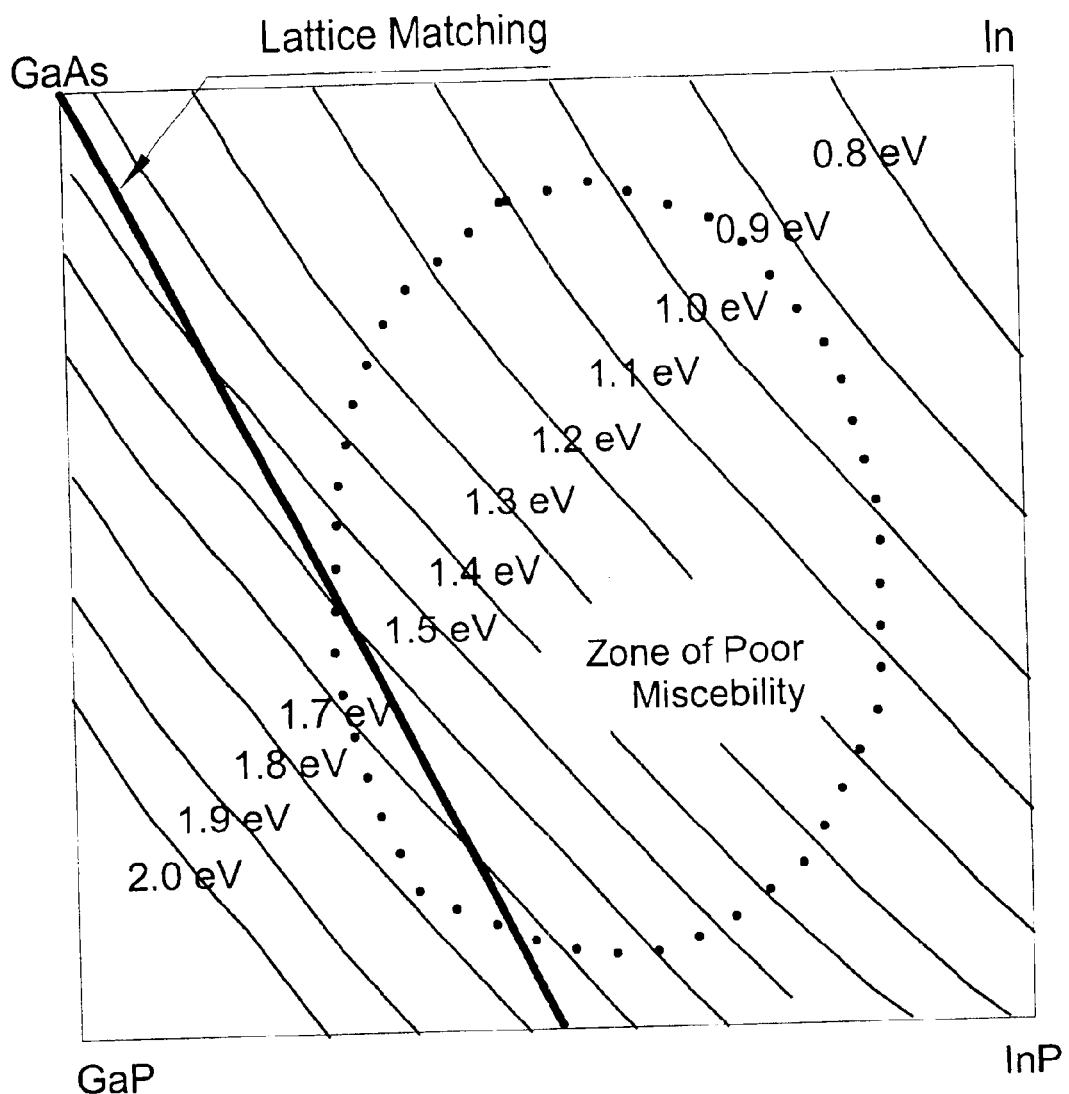
FIG. 4 shows the energy phase diagram for GaInAsP active layers employing different combinations of GaAs, InAs, InP and GaP layers which can be grown on GaAs substrates.

Heterostructures designed for laser operation at 8xx nanometers on a GaAs substrate have layers identified as AlGaInP/GaInP/$\underline{In_xGa_{1-x}As_{1-y}P_y}$, where x, y are small and where the underlined portion identifies the composition of the quantum well that may have a thickness of the order of 8 nanometers and where the constituents of the quantum well layer are adjusted in accordance with FIG. 4 to avoid the zone of poor miscibility, to achieve radiation at a desired wavelength, and the appropriate strain. Abutting each side of the quantum well layer it is desired to deposit a thick layer of nearly lattice matched, high Indium content, illustratively $Ga_{0.52}In_{0.48}P$, forming the waveguide, where the fraction of Indium is several times greater than the fraction of Indium in the quantum well layer. Thus, when the very thin quantum well is laid down on a layer having a much greater fraction of Indium, there will be a residual partial pressure, stemming from the large upstream deposits of previous deposited layer of the higher Indium fraction.

We have discovered that after the thick clad and waveguide layer of higher Indium content e.g. AlGaInP and GaInP are laid down and before the low Indium content quantum well layer is begun, a short interval, e.g., 3 seconds of trimethylgallium and phosphine should be introduced. This will encapsulate residual indium deposited on reactor surfaces upstream of the wafer and will grow a pseudomorphic $Ga_xIn_{1-x}P$ layer on the wafer, utilizing parasitic Indium, from the previous deposited layers. By doing so the somehow uncontrolled layer will have a higher energy than the following quantum well layer and will not participate in carrier recombination during laser operation or PL-measurement.

An exemplary heterostructure produced using the above procedure is shown in the table below:

(SEE NEXT PAGE)

| Layer | Thickness ($\mu$m) |
| --- | --- |
| AlGaInP: n-clad | 1.000 |
| GaInP | 0.7 |
| GaP shoulder | 0.0008 |
| InGaAs quantum well | 0.008 |
| GaInP | 0.7 |
| AlGaInP: p-clad | 1.0 |
| GaAs:p++ | 0.100 |

What is claimed is:

1. A method of simultaneously growing in a horizontal low pressure planetary MOCVD reactor a plurality of wafers having a gallium arsenide substrate for use in laser diodes, comprising the steps of:

a) planetarily rotating each of said plurality of wafers while growing thereon a high Indium content wave guide foundation layer exhibiting a high indium vapor pressure;

b) introducing into said reactor a short interval of trimethylgallium and phosphine to encapsulate residual indium deposited upstream of the wafer in a pseudomorphic layer of InGaP, utilizing residual indium remaining from the formation of said foundation layer; and c) growing a low Indium containing $In_xGa_{1-x}As_{1-y}P_y$ quantum well active region with precise Indium control, without disturbance by said residual Indium.

2. A method according to claim 1 wherein said active layer is a quantum well layer having the composition $In_xGa_{1-x}As_{1-y}P_y$ where x and y are small and adjusted to produce radiation at a specified wavelength.

3. A method according to claim 1 wherein said short interval of trimethylgallium gas deposits a layer of gallium phosphide having a nominal thickness of less than 1 nanometer over the surface of said plurality of wafers.

4. A semiconductor structure for a laser diode which does not emit spurious Q-line radiation, comprising a GaAs substrate;

an $In_{0.48}(Al_\alpha Ga_{1-\alpha})_{0.52}InP$ wave guide layer adjacent said substrate; and an active region having a thin, low in containing strata next to said waveguide layer, said active region having the composition $In_xGa_{1-x}As_{1-y}P_y$ where x and y are small and adjusted to produce radiation at a specified wavelength and wherein x is lower than $\alpha$ of said waveguide layer.

5. A semiconductor structure according to claim 4 wherein said waveguide layer is encapsulated in a pseudomorphic GaP layer having an average thickness less than one nanometer.

6. A semiconductor structure according to claim 5 wherein said adjustment of x and y avoids the zone of poor miscibility.

7. A semiconductor structure according to claim 6 wherein said adjustment of x and y establishes a predetermined lattice mismatch strain.

* * * * *